(12) United States Patent
Alberhasky et al.

(10) Patent No.: US 8,643,067 B2
(45) Date of Patent: Feb. 4, 2014

(54) STRAPPED DUAL-GATE VDMOS DEVICE

(75) Inventors: Scott J. Alberhasky, Portland, OR (US);
David E. Hart, Cornelius, OR (US);
Sudarsan Uppili, Portland, OR (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/249,529

(22) Filed: Sep. 30, 2011

(65) Prior Publication Data

US 2013/0082320 A1    Apr. 4, 2013

(51) Int. Cl.
*H01L 29/66*    (2006.01)

(52) U.S. Cl.
USPC ..... 257/263; 257/302; 257/328; 257/E29.262

(58) Field of Classification Search
USPC .......................................... 257/263, 302, 328
See application file for complete search history.

(56) References Cited

U.S. PATENT DOCUMENTS

| 6,391,723 B1* | 5/2002 | Frisina .......................... 438/268 |
| 2003/0047776 A1* | 3/2003 | Hueting et al. ................ 257/328 |
| 2006/0186434 A1* | 8/2006 | Magri' et al. .................. 257/135 |
| 2012/0126314 A1* | 5/2012 | Braithwaite et al. .......... 257/329 |

OTHER PUBLICATIONS

Power Electronics 101; International Rectifier; pp. 1-6.

* cited by examiner

*Primary Examiner* — Matthew Reames
(74) *Attorney, Agent, or Firm* — Advent, LLP

(57) ABSTRACT

Semiconductor devices are described that include a dual-gate configuration. In one or more implementations, the semiconductor devices include a substrate having a first surface and a second surface. The substrate includes a first and a second body region formed proximal to the first surface. Moreover, each body region includes a source region formed therein. The substrate further includes a drain region formed proximal to the second surface and an epitaxial region that is configured to function as a drift region between the drain region and the source regions. A dual-gate is formed over the first surface of the substrate. The dual-gate includes a first gate region and a second gate region that define a gap there between to reduce the gate to drain capacitance. A conductive layer may be formed over the first gate region and the second gate region to lower the effective resistance of the dual-gate.

8 Claims, 6 Drawing Sheets

STRAPPED DUAL-GATE VDMOS DEVICE

BACKGROUND

Power metal-oxide-semiconductor field-effect transistor (MOSFET) devices, such as vertical diffused metal oxide semiconductor (VDMOS) devices, are used in power application devices because they complement both bipolar devices and complementary metal-oxide-semiconductor CMOS devices through bi-polar-CMOS-DMOS (BCD) processes. For example, VDMOS devices may be used in power supplies, buck converters, and low voltage motor controllers to furnish power application functionality.

The on-state resistance ("$R_{ON}$"), the maximum breakdown voltage ("$BV_{DSS}$"), and the overall capacitances of the device are important characteristics of VDMOS designs. These characteristics are important operating parameters of the VDMOS devices, which dictate the applications with which the devices may be utilized. On-state resistance is usually dependent upon the design and layout of the device, the process condition, temperature, drift region length, doping concentration of the drift region, and the various materials used to fabricate the devices. Breakdown voltage is defined as the largest reverse voltage that can be applied to the drain of the transistor without causing an exponential increase in the current. Moreover, various parasitic capacitances in the devices lead to reduced operating frequency.

SUMMARY

Semiconductor devices, such as VDMOS devices, are described that include a strapped dual-gate configuration to reduce the gate to drain capacitance ($C_{gd}$) of the devices. In one or more implementations, the semiconductor devices include a semiconductor substrate having a first surface and a second surface. The semiconductor substrate includes a first and second body region formed proximal to the first surface. Each body region includes a source region formed therein. The semiconductor substrate further includes a drain region formed proximal to the second surface and an epitaxial region that is configured to function as a drift region between the drain region and the source regions. A dual-gate is formed over the first surface of the semiconductor substrate. The dual-gate includes a first gate region and a second gate region that define a gap there between to reduce the gate to drain capacitance. A conductive layer may be formed over the first gate region and the second gate region to lower an effective resistance of the dual-gate.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Power devices, such as buck converters, typically require an output device having a low resistance (e.g., $R_{ON}$) and low gate capacitance values to allow for increased operating frequencies. Thus, lower device capacitances allow for greater operating and performance efficiency.

Therefore, techniques are described to form semiconductor devices, in particular VDMOS devices, that include dual-gates to reduce the gate to drain capacitance ($C_{gd}$) of the devices. In one or more implementations, the semiconductor devices include a substrate having a first surface and a second surface. The substrate includes a first and a second body region formed proximal to the first surface. Each body region includes a source region formed therein. The substrate further includes a drain region formed proximal to the second surface and an epitaxial region that is configured to function as a drift region between the drain region and the source regions. In an implementation, the epitaxial region includes a junction field effect transistor (JFET) diffusion region to reduce the effective channel length of the device. A dual-gate is formed over the first surface of the substrate. The dual-gate includes a first gate region and a second gate region that define a gap there between to reduce the gate to drain capacitance. A conductive layer may be formed over the first gate region and the second gate region to lower the effective resistance of the dual-gate. The devices may also include one or more below source regions that may reduce the effective gate length of the dual-gate.

In the following discussion, an example semiconductor device is first described. Exemplary procedures are then described that may be employed to fabricate the example semiconductor device.

Example Implementations

Figure 1A:
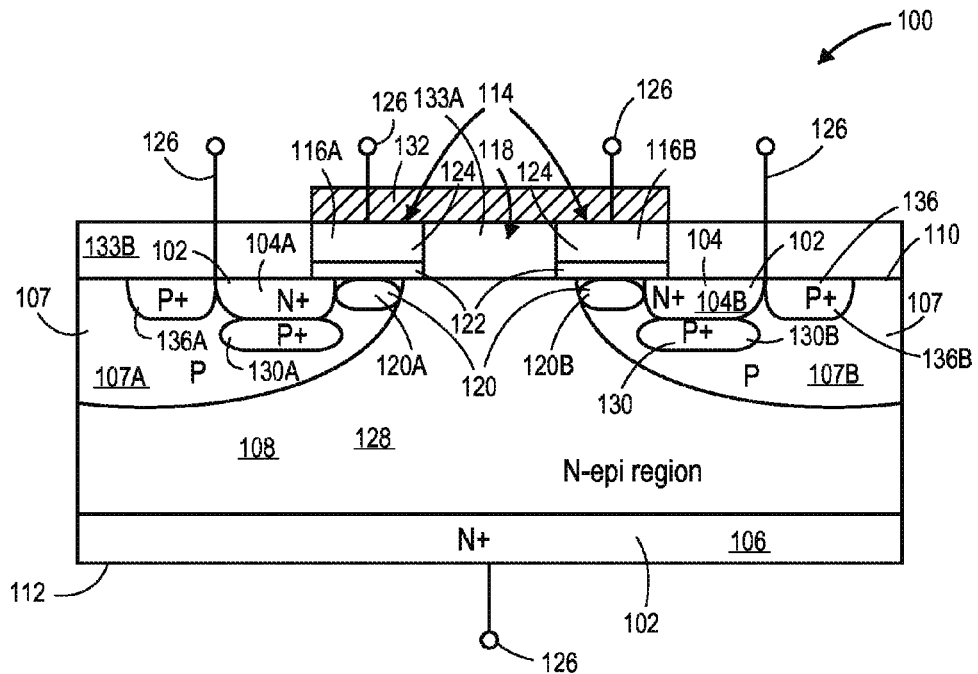
FIG. 1A is a diagrammatic partial cross-sectional view illustrating an implementation of a VDMOS device in accordance with an example implementation of the present disclosure.
Figure 1B:
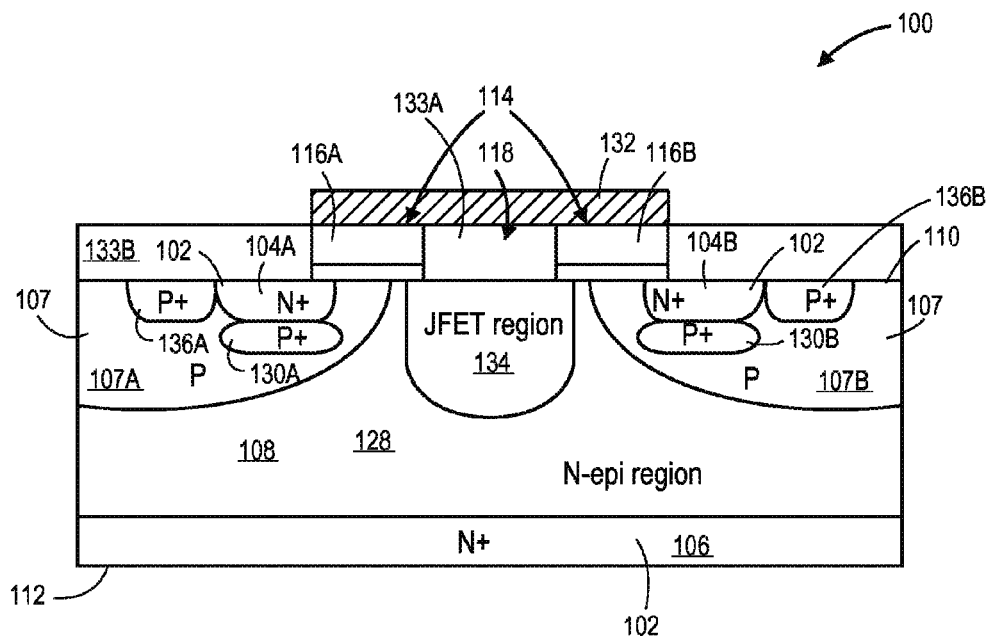
FIG. 1B is a diagrammatic partial cross-sectional view illustrating another implementation of a VDMOS device in accordance with another example implementation of the present disclosure, wherein the VDMOS device includes a JFET diffusion region.

FIGS. 1A and 1B illustrate vertically diffused metal-oxide semiconductor (VDMOS) devices 100 in accordance with example implementations of the present disclosure. As shown, the VDMOS device 100 includes one or more active regions 102 formed in a semiconductor substrate 108 (source regions 104 and a drain region 106 are illustrated). The active regions 102 are utilized to create integrated circuit device technology (e.g., complementary metal-oxide-semiconductor (CMOS) technology, microelectromechanical systems (MEMS) technology, etc.). In implementations, the active regions 102 provide charge carriers to the semiconductor substrate 108. For example, an active silicon region 102 may comprise a material of a first conductivity type (e.g., n-type diffusion region) that provides extra conduction electrons as charge carriers. In another example, an active silicon region 102 may comprise material of a second conductivity type (e.g., p-type diffusion region) that is configured to provide extra holes as charge carriers. As shown in FIGS. 1A and 1B, the source regions 104 are formed proximate to a first surface 110 of the substrate 108, and the drain region 106 is formed proximate to a second surface 112 of the substrate 108. For example, the source regions 104 are formed below and adjacent the surface 110, and the drain region is formed below and adjacent to the surface 112.

As shown in FIGS. 1A and 1B, the device 100 includes a first source region 104A and a second source region 104B, as well as a single drain region 106. The source regions 104A, 104B are formed in body regions 107 (e.g., the first source region 104A is formed in a first body region 107A and the second source region 104B is formed in a second body region 107B). The body regions 107A, 107B are comprised of a dopant material of a second conductivity type (e.g., p-type material). In one or more implementations, the source regions 104A, 104B and the body regions 107A, 107B may be self-aligned regions fabricated through suitable self-alignment implantation techniques (e.g., implantation, annealing, etc.). In one or more implementations, the body regions 107A, 107B may have a dopant concentration of about $1\times10^{16}/cm^3$ to about $1\times10^{18}/cm^3$ of the second conductivity type.

The semiconductor substrate 108 comprises a base material utilized to form one or more integrated circuit devices through various semiconductor fabrication techniques, such as photolithography, ion implantation, deposition, etching, and so forth. In one or more implementations, the substrate 108 comprises a portion of a silicon wafer that may be configured in a variety of ways. For example, the substrate 108 may comprise a portion of an n-type silicon wafer or a portion of a p-type silicon wafer. In an implementation, the substrate 108 may comprise group V elements (e.g., phosphorus, arsenic, antimony, etc.) configured to furnish n-type charge carrier elements. In another implementation, the substrate 108 may comprise group IIIA elements (e.g., boron, etc.) configured to furnish p-type charge carrier elements.

The devices 100 include a dual-gate 114 that is formed over the surface 110. As shown, the dual-gate 114 includes two gate regions 116 (a first gate region 116A and a second gate region 116B) that define a gap 118 there between. The first gate region 116A is formed at least partially over the first source region 104A and the first body region 107A. The second gate region 116B is formed at least partially over the second source region 104B and the second body region 107B. Thus, conduction regions 120 are formed within the body regions 107A, 107B that are below the two gate regions 116A, 116B when a voltage of correct polarity and a value greater than a threshold voltage ($V_t$) of the device 100 is applied to the dual-gate 114. For example, a first conduction region 120A is associated with the first gate region 116A, and the second conduction region 120B is associated with the second gate region 116B. The conduction regions 120 establish a conducting channel through which charge carriers (e.g., majority carriers) can travel between the source regions 104 and the drain region 106. As shown, the dual-gate 114 may include a first layer 122, such as a dielectric layer, disposed between the surface 110 and a second layer 124 (e.g., a polycrystalline silicon (polysilicon) layer or a metal electrode layer). In one or more implementations, the first layer 122 may comprise a gate oxide material, such as silicon dioxide ($SiO_2$), a nitride material, a high-κ material, or the like. The second layer 124 may further include a silicide material to lower the resistivity of the layer 124. In various implementations, the thickness of the gate may range from approximately one hundred (100) Angstroms to approximately one hundred thousand (100,000) Angstroms. However, the thickness of the dual-gate 114 may vary as a function of the requirements (e.g., manufacturability, operating frequency, gain, efficiency, etc.) of the device 100.

The source regions 104, the drain region 106, and the gate regions 116A, 116B have contacts 126 (e.g., an electrode) that provide electrical interconnection functionalities between various components of devices 100. The contacts 126 may be configured in a variety of ways. For example, the contacts 126 may be comprised of a polysilicon material, a metal one (metal 1) material, a metal two (metal 2) material, and so forth. In some applications, the contacts 126 may include vias that provide a vertical electrical connection between different layers of the device 100. For instance, a first via may provide an electrical interconnect to a drain contact 126 formed proximate to the first surface 110 and disposed under various device 100 layers (e.g., passivation layers, insulation layers, etc.).

The semiconductor device 100 further includes an epitaxial region 128 that is configured as a path for majority carriers to travel when the device 100 is operational. For instance, the epitaxial region 128 is configured to function as a drift region when the device 100 is operational. As illustrated in FIGS. 1A and 1B, the epitaxial region 128 extends from under the dual-gate 114 to the drain region 106. Moreover, the epitaxial region 128 at least partially encloses the body regions 107A, 107B. The epitaxial region 128 is comprised of material of the first conductivity type. However, the doping profile of the epitaxial region 128 is lower than the doping profile of the source regions 104A, 104B. For example, the epitaxial region 128 may have a dopant concentration of about $1\times10^{14}/cm^3$ to about $1\times10^{17}/cm^3$ of the first conductivity type. The electric field across the epitaxial region 128 may be manipulated by the doping profile and the thickness of the epitaxial region 128 when the device 100 is operational. Thus, it is contemplated that various doping profiles and thicknesses of the epitaxial region 128 may be utilized depending on the requirements (e.g., breakdown voltage value, operating voltages, etc.) of the VDMOS devices 100.

As shown in FIGS. 1A and 1B, the device 100 may include below source regions 130 (e.g., a first below source region 130A, a second below source region 130B) that are disposed below each of the source regions 104A, 104B. The below source regions 130 comprise material of a second conductivity type. In an implementation, the below source regions 130 may be boron implanted regions. The regions 130 are configured to reduce the effective gate length of the dual-gate 114 in the VDMOS devices 100. The regions 130 may have a dopant concentration of about $5\times10^{16}/cm^3$ to about $1\times10^{19}/cm^3$ of the second conductivity type. The VDMOS devices 100 may have varying doping profiles that depend on the requirements of the devices 100. In an implementation, the first region 130A and the second region 130B may have approximately the same dopant concentration. In another implementation, the first region 130A may have a first dopant concentration, and the second region 130B may have a second dopant concentration that is different from the first dopant concentration. The dopant concentration of the regions 130 may be higher than the dopant concentration of the body regions 107.

Figure 1C:
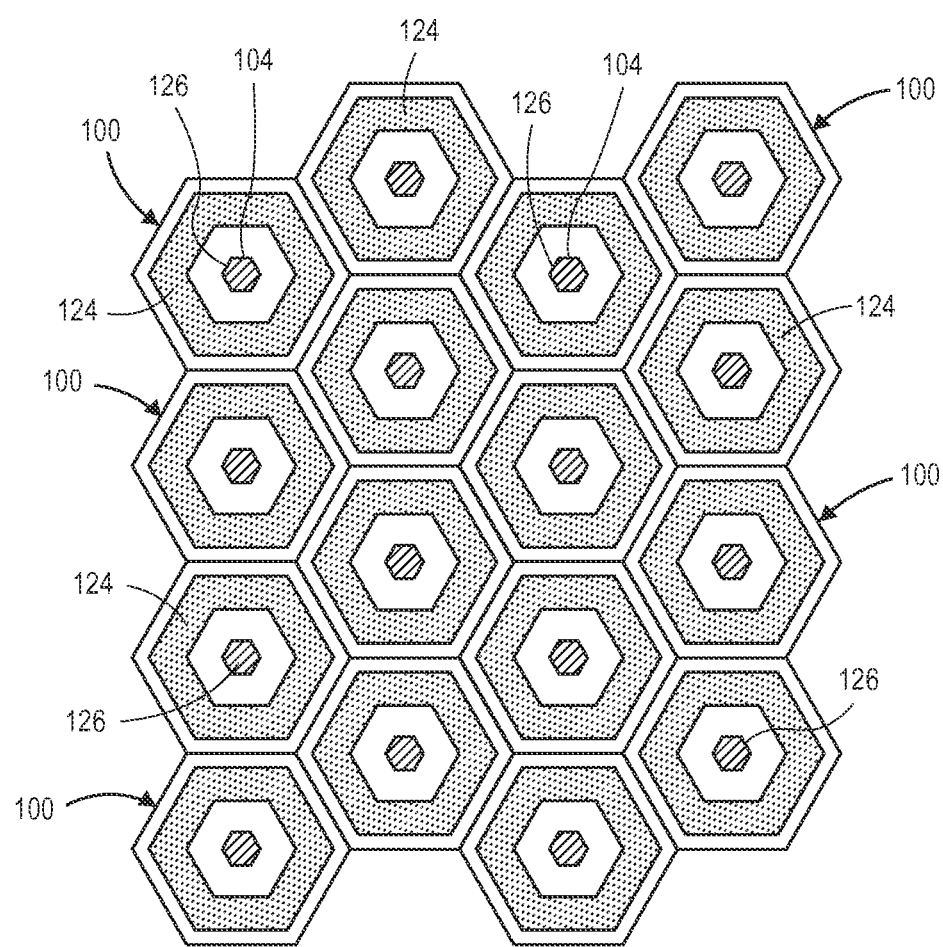
FIG. 1C is a diagrammatic partial pan view illustrating an example hexagonal layout configuration that can be utilized with the VDMOS devices described in the present disclosure.

The VDMOS devices 100 include a conductive layer 132 disposed over the dual-gate 114. In an implementation, the conductive layer 132 extends over the first gate region 116A, the second gate region 116B, and an insulation region 133A disposed in the gap 118. The conductive layer 132 is configured to connect (e.g., strap) the gate regions 116A, 116B together and to lower the effective resistance of the dual-gate 114. For instance, in simulations, the conductive layer 132 has lowered the resistance of the dual-gate 114 greater than silicide regions or doped polysilicon regions alone. Thus, the lower resistance may allow for improved switching speed of the VDMOS devices 100. The conductive layer 132 also allows for local interconnections of other separate dual-gate regions of other MOSFET devices formed in the semiconductor substrate 108. Thus, a hexagon cell layout configuration, such as the hexagon layout configuration shown in FIG. 1C, may be utilized for layout of the VDMOS devices 100. Advantages provided by the hexagon layout include greater packing density of semiconductor devices and reduced $R_{ON}$*area values. In one or more implementations, the conductive layer 132 may be comprised of a metal layer, such as aluminum, or the like. The conductive layer 132 may be referred to as a "M0" layer. For instance, the conductive layer 132 may have a thickness of about 0.1 microns to about 0.5 microns. In an example, the conductive layer 132 may have a thickness of about 0.2 microns (2000 Angstroms). As shown, the insulation layer 133A is disposed in the gap 118, and the insulation layer 133B is disposed at least partially over the surface 110. In one or more implementations, the insulation regions 133A, 133B may comprise a dielectric material, such as a silicon dioxide ($SiO_2$) material, a benzocyclobutene (BCB) material, or the like. In an implementation, the insulation layers 133A, 133B may be formed through different deposition and removal (e.g., etching, planarizing, etc.) processes.

As shown in FIG. 1B, the devices 100 may also include a junction field effect transistor (JFET) diffusion region 134 disposed in the epitaxial region 128. The JFET diffusion region 134 is encompassed by the epitaxial region 128 and extends from about the first surface 110 (e.g., positioned underneath the gate regions 116A, 116B and the dielectric region 134) to below at least one of the body regions 107 (first body region 107A, second body region 107B). The JFET diffusion region 134 is comprised of a first conductivity material. The JFET diffusion region 134 has a doping concentration that is greater than the doping concentration of the epitaxial region 128 to reduce the channel resistance of the devices 100. For example, the JFET diffusion region 134 may have a dopant concentration of about $1 \times 10^{15}/cm^3$ to about $1 \times 10^{17}/cm^3$ of the first conductivity type.

As described above, the first gate region 116A and the second gate region 116B of the dual-gate 114 define a gap 118 to allow for a reduction of the gate to drain capacitance ($C_{gd}$) (e.g., the overlap of the dual-gate 114 and the epitaxial region 128 (as well as the JFET diffusion region 134 in some implementations)).

As shown in FIGS. 1A and 1B, the VDMOS devices 100 may also include body contact regions 136A, 136B that are comprised of a second conductivity type (shown as P+ region in FIGS. 1A and 1B). In one or more implementations, the source regions 104A, 104B and the body contact regions 136A, 136B are tied together by the contacts 126 to improve reliability of the devices 100 and to reduce parasitic effects. For example, the source region 104A is tied together with the body contact region 136A by a first contact 126, and the source region 104B is tied together with the body contact region 136B by a second contact 126.

It will be understood that while FIGS. 1A and 1B illustrate an n-channel VDMOS device 100, the devices 100 may be fabricated as p-channel devices. For example, a p-channel device may include p-type source and drain regions, a p-type drift region, and so forth.

Example Fabrication Processes

Figure 2:
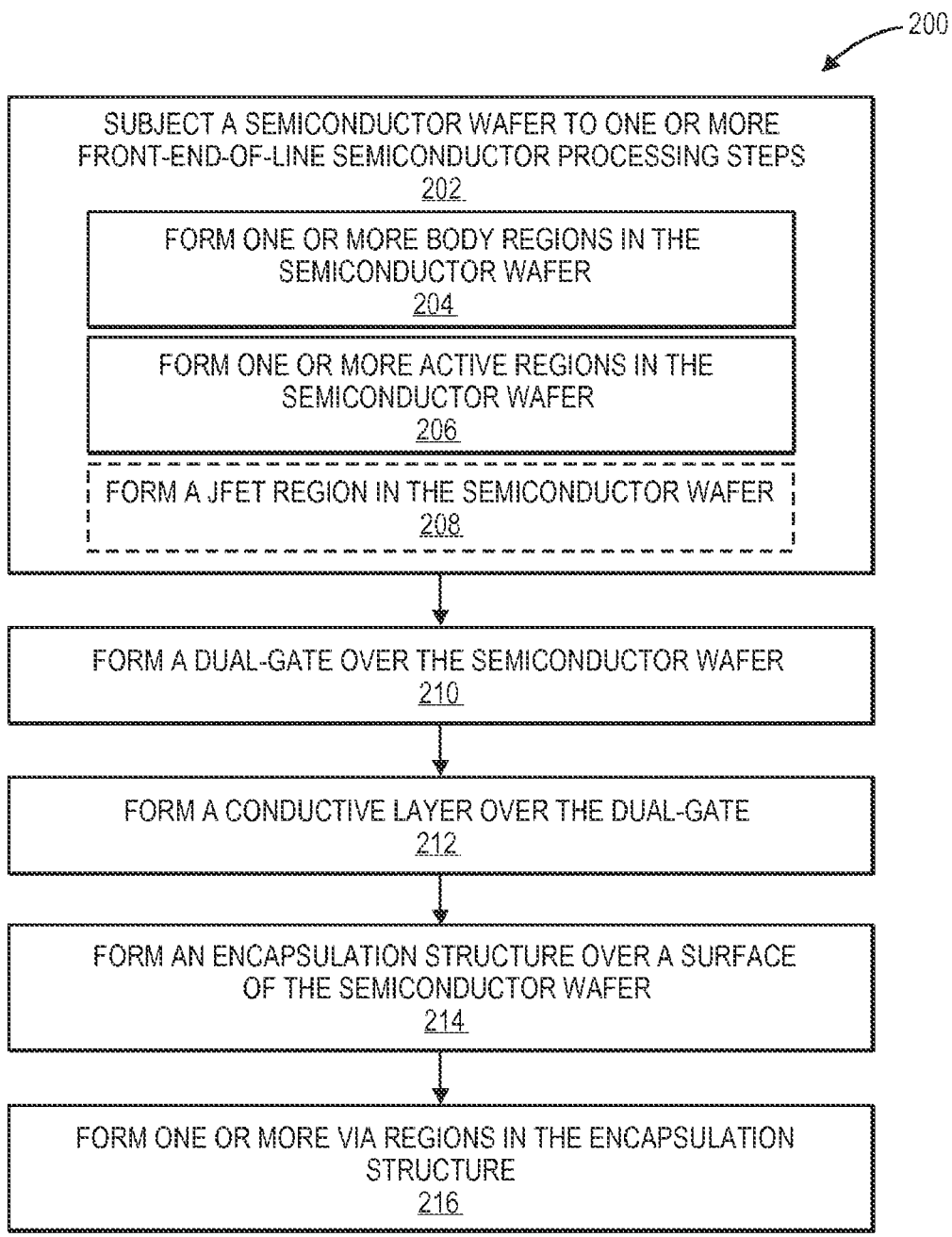
FIG. 2 is a flow diagram illustrating a process in an example implementation for fabricating VDMOS devices, such as the devices shown in FIGS. 1A and 1B.
Figure 3A:
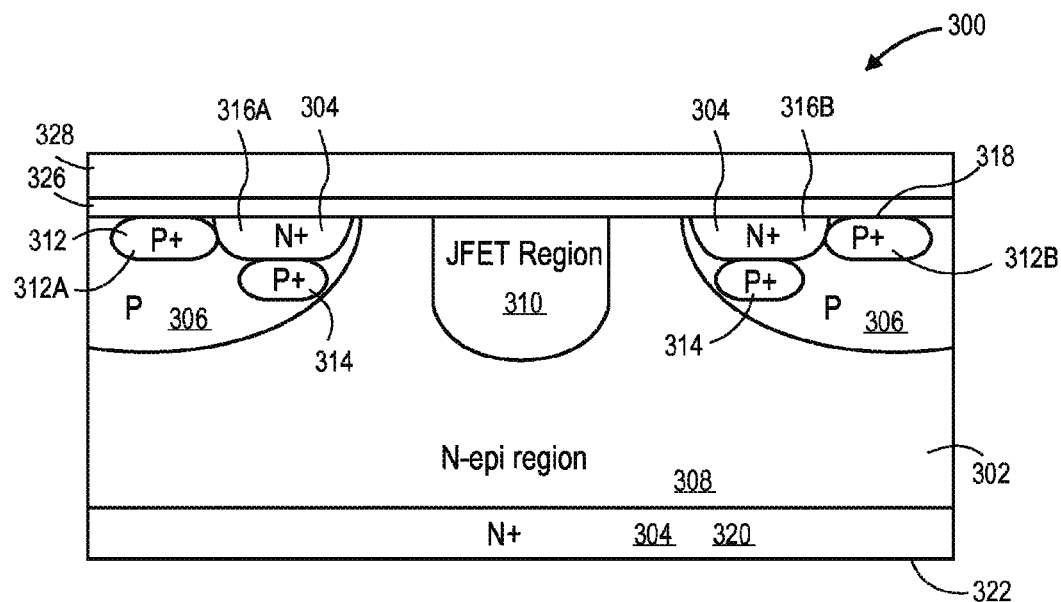
FIGS. 3A through 3E are diagrammatic partial cross-sectional views illustrating the fabrication of a VDMOS device, such as the device shown in FIGS. 1A and 1B, in accordance with the process shown in FIG. 2.
Figure 3B:
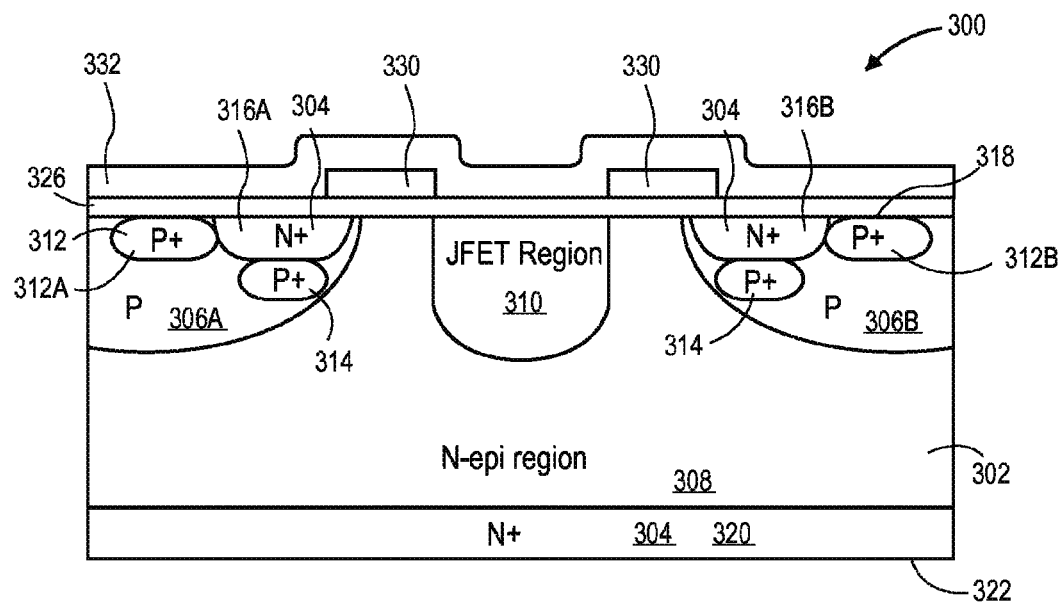

FIG. 2 illustrates an example process 200 that employs semiconductor fabrication techniques to fabricate semiconductor devices having strapped dual-gate configurations, such as the devices 100 shown in FIGS. 1A and 1B. FIGS. 3A through 3E illustrate formation of example VDMOS devices 300 in an example semiconductor wafer 302. As illustrated in FIG. 2, a semiconductor wafer is subjected to one or more front-end-of-line (FEOL) semiconductor processing steps (Block 202). The FEOL processing steps may include, but are not limited to: forming through a suitable implantation technique (e.g., ion implantation, etc.) one or more body regions in the semiconductor wafer (Block 204), forming through a suitable implantation technique one or more active regions in the semiconductor wafer (Block 206), and forming through a suitable implantation technique a JFET region in the semiconductor wafer (Block 208). For example, as shown in FIG. 3A, the semiconductor wafer 302 may include one or more active regions 304 of a first conductivity type (e.g., n-type dopant material), one or more body regions 306 of a second conductivity type (e.g., p-type dopant material), an epitaxial region 308 that is configured to function as a drift region during operation, a JFET region 310 of the first conductivity type formed in the epitaxial region 308 and extends below the body regions 306, one or more body contact regions 312 of the second conductivity type formed in each of the body regions 306 (e.g., a first body contact region 312A formed in a first body region 306A, a second body contact region 312B formed in a second body region 306B), and one or more below source regions 314 of the second conductivity type formed in each of the body regions 306 (e.g., a first body contact region 312A formed in a first body region 306A, a second body contact region 312B formed in a second body region 306B). The one or more active regions 304 include one or more source regions 316 (source regions 316A, 316B) formed adjacent to the top surface 318 of the wafer 302 and a drain region 320 formed adjacent to a bottom surface 322 of the wafer 302. Thus, all major frontend heat cycles have been completed before formation of the dual-gate 324 begins.

Figure 3C:
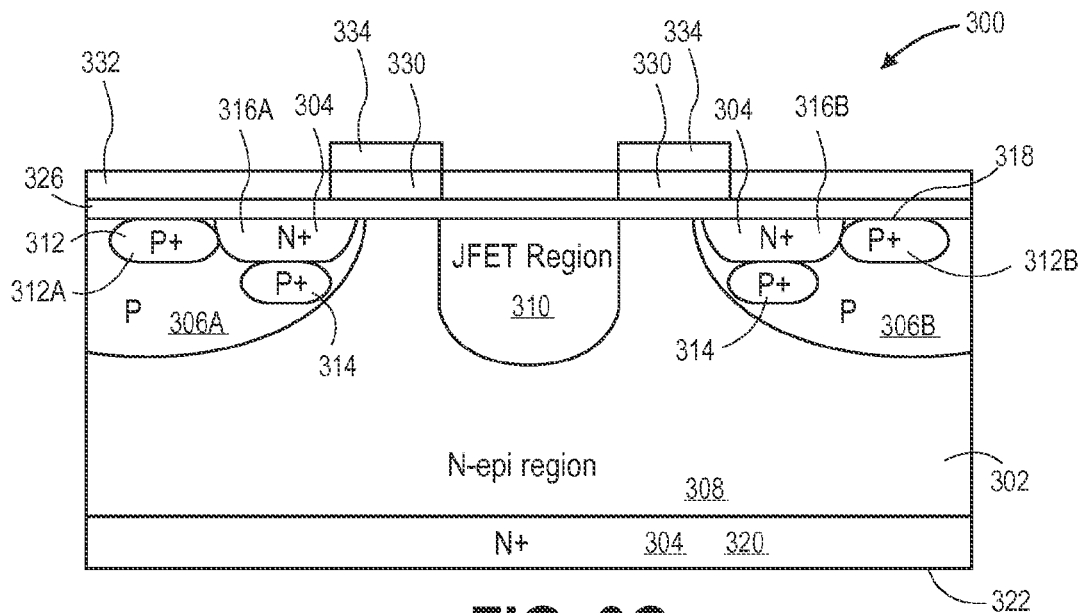
Figure 3D:
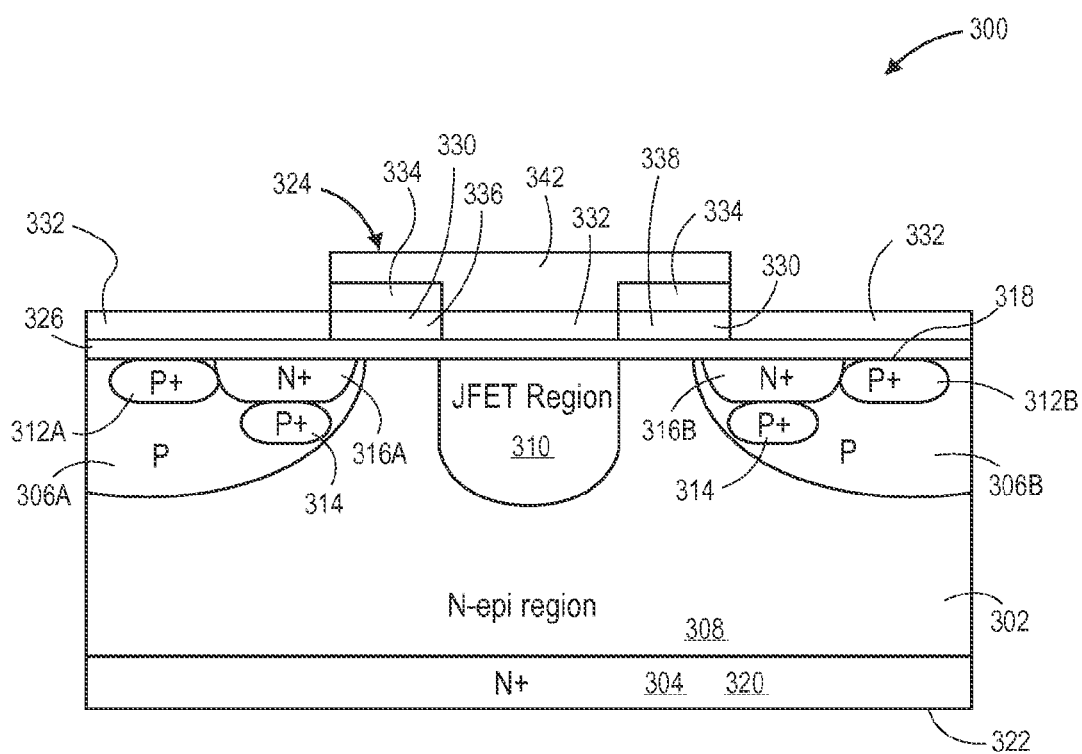

A dual-gate is formed over the semiconductor wafer (Block 210). As shown in FIG. 3A, an oxide layer 326 and a polysilicon layer 328 are deposited over a top surface 318 of the wafer 302. The polysilicon layer 328 may be defined through various gate definition processes. For example, the polysilicon layer 328 may be subjected to a suitable photolithography process and a suitable etching process to form polysilicon regions 330 (see FIG. 3B). Once the polysilicon regions 330 are defined, an oxide layer 332 is deposited over the oxide layer 326 and the polysilicon regions 330. The oxide layer 332 is subjected to a suitable planarization process to at least partially expose the polysilicon regions 330 as shown in FIG. 3C. The planarization process is configured to stop on polysilicon (e.g., polysilicon regions 330). In an implementation, the planarization process may comprise a chemical-mechanical planarization (CMP) technique that may include a selectivity of about five hundred to one (500:1) of oxide to polysilicon. Once the polysilicon regions 330 are at least partially exposed, a silicide layer 334 is formed over the polysilicon regions 330 (see FIG. 3C). In one or more implementations, the silicide layer 334 may be a self-aligned silicide layer, or the like. As illustrated, the dual-gate 324 comprises a first gate region 336 and a second gate region 338 that define a gap 340.

A conductive layer is formed over the dual-gate (Block 212). For example, the conductive layer 342 may be first deposited and then selectively etched so that the conductive layer 342 connects (e.g., straps together) the first gate region 336 and the second gate region 338 (see FIG. 3D). The conductive layer 342 serves to reduce the resistance of the gate regions 336, 338. In one or more implementations, the conductive layer 326 may comprise any conductive material, such as aluminum, and may be about 0.1 microns to about 0.5 microns. In a specific implementation, the conductive layer 342 may have a thickness about 0.2 microns (2000 Angstroms).

Figure 3E:
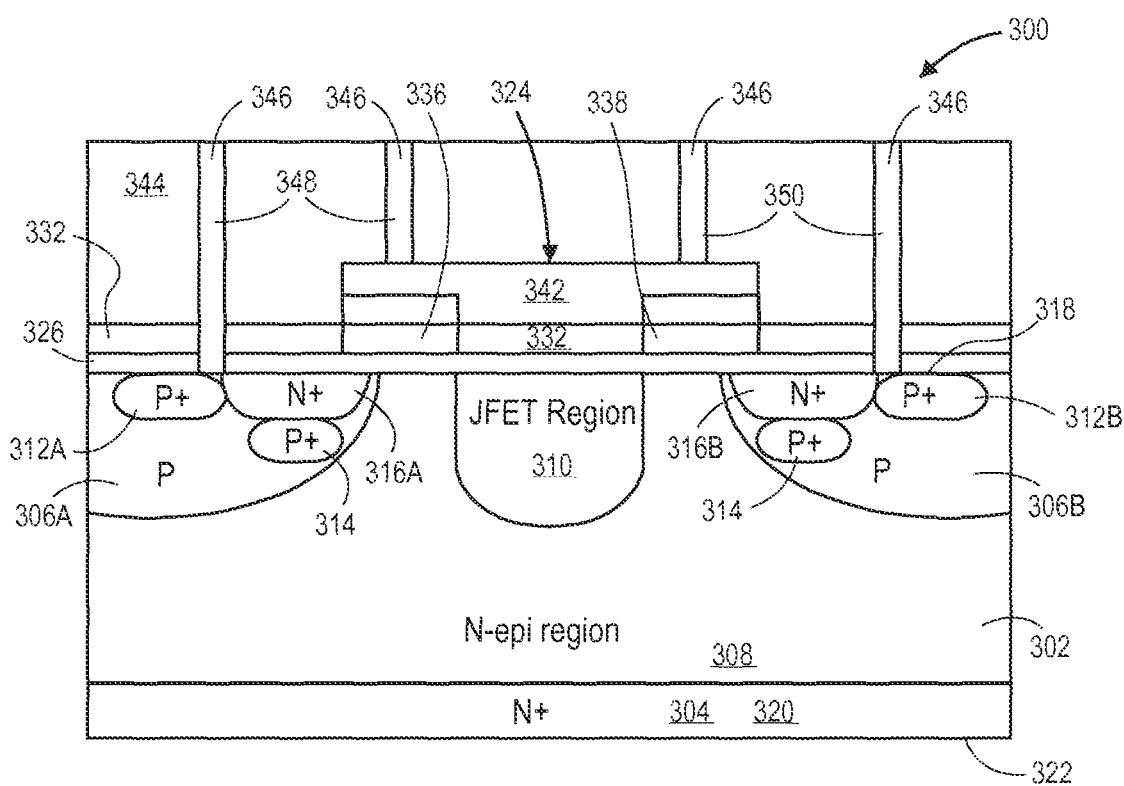

An encapsulation structure is formed over the surface of the semiconductor wafer (Block 214). As shown in FIG. 3E, an encapsulation structure 344 is formed over the surface 318 of the wafer 302 to enclose the dual-gate 324. The encapsulation structure 344 may be configured in a variety of ways. For example, the encapsulation structure 344 may comprise a dielectric material, such as a silicon dioxide ($SiO_2$) material, a benzocyclobutene (BCB) material, or the like. One or more via regions are formed in the encapsulation structure (Block 216). FIG. 3E illustrates via regions 346 formed through one or more etching processes (e.g., wet etching, dry etching) in the encapsulation structure 344 to allow connections to the dual-gate 324 (the first gate region 336, the second gate region 338), and the source regions 316A, 316B. A conductive material 348 is deposited (e.g., e.g., physical vapor deposition, chemical vapor deposition, molecular beam epitaxy, etc.) in the via regions 336 to form contacts 350 that provide electrical interconnections between various components of the device 300. In one or more implementations, the conductive material 348 may be comprised of a polysilicon material, a metal 1 material, a metal 2 material, and so forth. The contacts 350 form electrodes for the dual-gate 324 and the source regions 316A, 316B.

While FIGS. 3A through 3E illustrate an n-channel VDMOS device 300, the devices 300 may also be fabricated as p-channel devices.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A semiconductor device comprising:
a substrate having a first surface and a second surface;
a first source region of a first conductivity type and a first body region of a second conductivity type formed in the substrate proximal to the first surface, the first source region formed in the first body region;
a second source region of the first conductivity type and a second body region of a second conductivity type formed in the substrate proximal to the first surface, the second source region formed in the second body region;
a drain region of a first conductivity type formed in the substrate proximal to the second surface;
an epitaxial region of a first conductivity type formed in the substrate configured to function as a drift region between the drain region and the first and the second source regions;
a dual-gate formed over the first surface and including a first gate region proximal to the first body region and a second gate region proximal to the second body region, the first gate region and the second gate region defining a gap there between;
a conductive layer formed over the first gate region and the second gate region, wherein at least one of the first source region, the second source region, or the drain region is a hexagonal shape; and
a junction field effect transistor (JFET) diffusion region of a first conductivity type disposed in the epitaxial region, the JFET diffusion region extending from the first surface to below the first body region or the second body region.

2. The semiconductor device as recited in claim 1, wherein the epitaxial region includes a first dopant concentration and the JFET diffusion region comprises a second dopant concentration, wherein the first dopant concentration is higher than the second dopant concentration.

3. The semiconductor device as recited in claim 1, wherein a thickness of the conductive layer is about 0.1 microns to about 0.5 microns.

4. The semiconductor device as recited in claim 3, wherein the conductive layer comprises aluminum.

5. A semiconductor device comprising:
a substrate having a first surface and a second surface;
a first source region of a first conductivity type and a first body region of a second conductivity type formed in the substrate proximal to the first surface, the first source region formed in the first body region;
a second source region of the first conductivity type and a second body region of a second conductivity type formed in the substrate proximal to the first surface, the second source region formed in the second body region;
a drain region of a first conductivity type formed in the substrate proximal to the second surface;
an epitaxial region of a first conductivity type formed in the substrate configured to function as a drift region between the drain region and the first and the second source regions,
the epitaxial region having a dopant concentration of about $1\times10^{14}/cm^3$ to about $1\times10^{17}/cm^3$;
a dual-gate formed over the first surface and including a first gate region proximal to the first body region and a second gate region proximal to the second body region, the first gate region and the second gate region defining a gap there between;
a conductive layer formed over the first gate region and the second gate region, wherein at least one of the first source region, the second source region, or the drain region is a hexagonal shape; and
a junction field effect transistor (JFET) diffusion region of a first conductivity type disposed in the epitaxial region, the JFET diffusion region extending from the first surface to below the first body region or the second body region.

6. The semiconductor device as recited in claim 5, wherein the epitaxial region includes a first dopant concentration and the JFET diffusion region comprises a second dopant concentration, wherein the first dopant concentration is higher than the second dopant concentration.

7. The semiconductor device as recited in claim 5, wherein a thickness of the conductive layer is about 0.1 microns to about 0.5 microns.

8. The semiconductor device as recited in claim 7, wherein the conductive layer comprises aluminum.

* * * * *